(12) United States Patent
Shibata (10) Patent No.: US 11,728,674 B2
(45) Date of Patent: Aug. 15, 2023

(54) POWER SOURCE CONTROL DEVICE

(71) Applicant: TOYOTA JIDOSHA KABUSHIKI KAISHA, Toyota (JP)

(72) Inventor: Hikaru Shibata, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/650,403

(22) Filed: Feb. 9, 2022

(65) Prior Publication Data

US 2022/0271559 A1 Aug. 25, 2022

(30) Foreign Application Priority Data

Feb. 25, 2021 (JP) ................... 2021-029270

(51) Int. Cl.
| | |
|---|---|
| *B60L 3/00* | (2019.01) |
| *G01R 31/54* | (2020.01) |
| *G05D 1/00* | (2006.01) |
| *H02J 9/06* | (2006.01) |
| *B60R 16/033* | (2006.01) |
| *G01R 31/387* | (2019.01) |
| *B60L 58/18* | (2019.01) |
| *H02J 7/00* | (2006.01) |

(52) U.S. Cl.
CPC .............. *H02J 9/061* (2013.01); *B60L 58/18* (2019.02); *B60R 16/033* (2013.01); *G01R 31/387* (2019.01); *H02J 7/0025* (2020.01); *H02J 7/007182* (2020.01)

(58) Field of Classification Search
USPC ........................................ 307/64, 9.1, 10.1
See application file for complete search history.

(56) References Cited

U.S. PATENT DOCUMENTS

| | | | |
|---|---|---|---|
| 2019/0260225 A1 | 8/2019 | Hida et al. | |
| 2021/0184491 A1 | 6/2021 | Hida et al. | |
| 2022/0091193 A1* | 3/2022 | Kwon | ................. G05D 1/0088 |

FOREIGN PATENT DOCUMENTS

JP 2019-146305 A 8/2019

* cited by examiner

*Primary Examiner* — Toan T Vu
*Assistant Examiner* — Xuan Ly
(74) *Attorney, Agent, or Firm* — Oblon, McClelland, Maier & Neustadt, L.L.P.

(57) ABSTRACT

A redundant power source ECU detects for failure of a power source of a primary system from a first DC-to-DC converter. In cases in which a failure has been detected during autonomous driving, the redundant power source ECU performs control to cause operation by a sub battery of a predetermined secondary system component that draws an inrush current, regardless of whether or not operation has been requested.

7 Claims, 12 Drawing Sheets

POWER SOURCE CONTROL DEVICE

CROSS-REFERENCE TO RELATED APPLICATION

This application is based on and claims priority under 35 USC § 119 from Japanese Patent Application No. 2021-029270 filed on Feb. 25, 2021, the disclosure of which is incorporated by reference herein.

TECHNICAL FIELD

The present disclosure relates to power source control device including plural batteries that redundantly controls power supply.

RELATED ART

Japanese Patent Application Laid-Open (JP-A) No. 2019-146305 (Patent Document 1) proposes a power source system including a first battery connected to a first load, a second battery, and a connection switchover section. The connection switchover section includes a DC-to-DC converter connecting the first battery and the second battery, a first switch connecting the first battery and a second load, and a second switch connecting the second battery and the second load. The connection switchover section selectively switches between a first mode (manual driving mode) in which the first switch is closed and the second switch is open, and a second mode (autonomous driving mode) in which the first switch is open and the second switch is closed.

In the technology disclosed in Patent Document 1, in cases in which a main power source has failed during the second mode, operation of a required load can be guaranteed by a sub battery. However, since a back-up voltage is affected by current flow and the passage of time, there is room for improvement in order to suppress a drop in the back-up voltage.

In consideration of the above circumstances, the present disclosure provides a power source control device that is capable of suppressing a sub battery voltage from dropping to a predetermined guaranteed voltage or below, and is capable of redundantly supplying power.

SUMMARY

A power source control device for a vehicle according to a first aspect includes a detector and a controller. The detector is configured to detect failure of a main power source. The controller is configured to perform operational control of a component supplied with power from a sub battery such that a predetermined guaranteed voltage is maintained for at least a predetermined requested duration in cases in which failure of the main power source has been detected by the detector during autonomous driving of the vehicle.

In the first aspect, the detector detects for failure of the main power source. The controller performs operational control of the component supplied with power from the sub battery such that the predetermined guaranteed voltage is maintained for at least the predetermined requested duration in cases in which failure of the main power source has been detected by the detector during autonomous driving. Thus, the sub battery voltage can be suppressed from dropping to the predetermined guaranteed voltage or below, and power can be redundantly supplied.

In a second aspect, as the operational control the controller may cause operation by the sub battery of a predetermined component that draws an inrush current regardless of whether or not operation has been requested. This enables the component that draws an inrush current to be caused to operate prior to the sub battery voltage falling to the guaranteed voltage or below, thereby enabling the voltage to be suppressed from dipping to the guaranteed voltage or below.

In a third aspect, as the operational control, the controller may limit a power supply from the sub battery to a predetermined interruptible component. This enables the time taken for the voltage to drop to the predetermined guaranteed voltage or below to be lengthened, and enables the voltage to be suppressed from falling to the guaranteed voltage or below within a pre-requested duration. In such cases, in a fourth aspect, the controller may limit the power supply either after a predetermined duration has elapsed or in cases in which a voltage of the sub battery has fallen to a predetermined voltage or below.

In a fifth aspect, in cases in which the failure of the main power source has been detected by the detector during autonomous driving of the vehicle, the controller may cause operation by the sub battery of a component that draws an inrush current regardless of whether or not operation has been requested and then perform control to limit a power supply from the sub battery to a predetermined interruptible component. This enables the component that draws an inrush current to be caused to operate prior to the sub battery voltage falling to the guaranteed voltage or below, enabling the time taken for the voltage to drop to the predetermined guaranteed voltage or below to be lengthened, and enabling the voltage to be suppressed from falling to the guaranteed voltage or below within a pre-requested duration. In such cases, in a sixth aspect, the controller may perform control to limit the power supply in cases in which a voltage of the sub battery has fallen to a predetermined voltage or below after the controller has performed control to cause operation by the sub battery of the predetermined component that draws an inrush current.

As described above, the present disclosure enables a power source control device to be provided that is capable of suppressing the sub battery voltage from dropping to the predetermined guaranteed voltage or below, and is capable of redundantly supplying power.

DETAILED DESCRIPTION

Detailed explanation follows regarding an example of exemplary embodiments of the present disclosure, with reference to the drawings.

First Exemplary Embodiment

Figure 1:
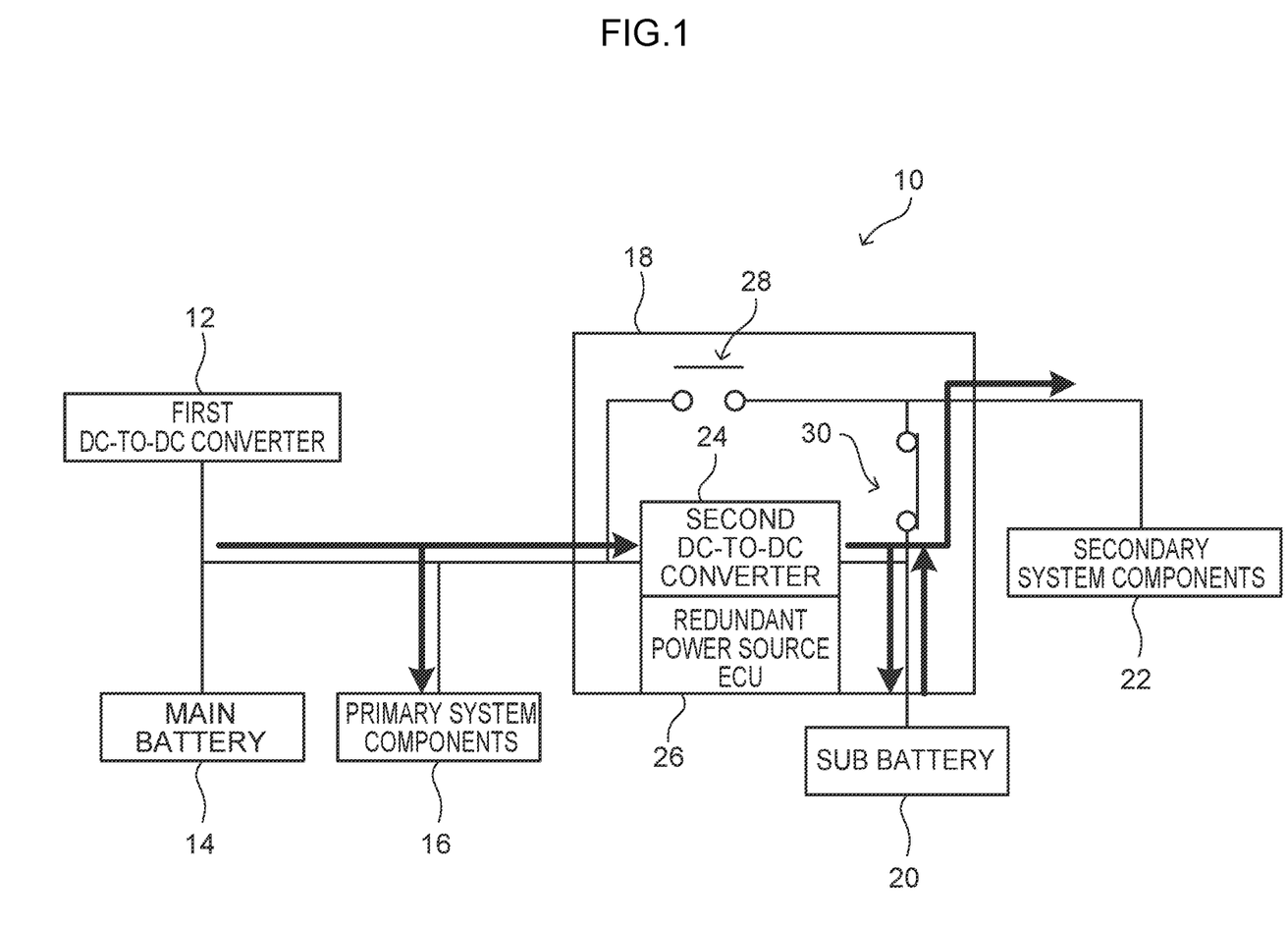
FIG. 1 is a diagram illustrating a schematic configuration of a vehicle power source system including a power source control device (in a state of power source supply for autonomous driving) according to an exemplary embodiment.
Figure 2:
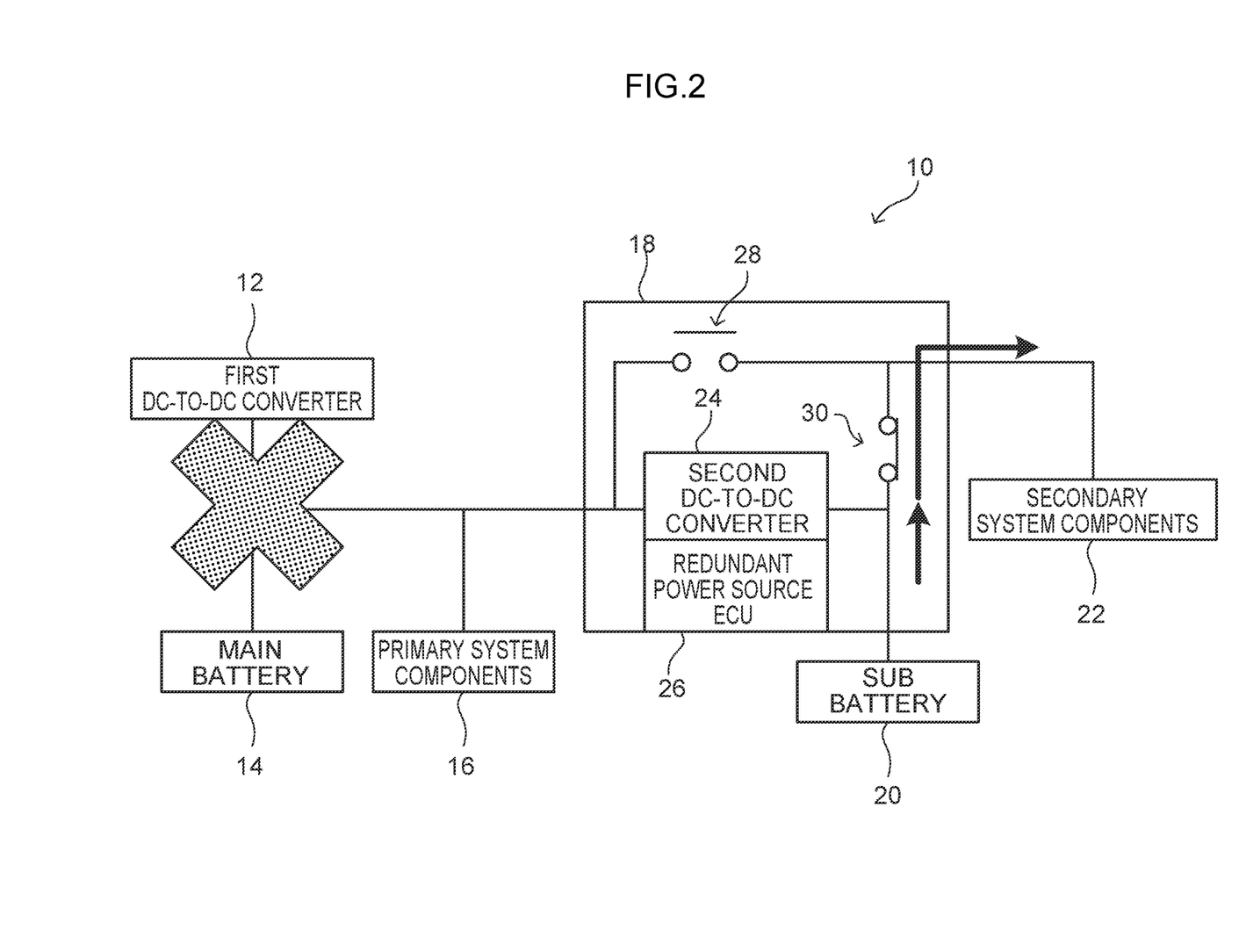
FIG. 2 is a diagram illustrating a schematic configuration of a vehicle power source system including a power source control device (in a failed state of a primary power source during autonomous driving) according to an exemplary embodiment.

FIG. 1 is a diagram illustrating a schematic configuration of a vehicle power source system including a power source control device (in a state of power source supply for autonomous driving) according to a first exemplary embodiment. FIG. 2 is a diagram illustrating a schematic configuration of the vehicle power source system including the power source control device (in a failed state of a primary power source during autonomous driving) according to the present exemplary embodiment. Note that as an example, a vehicle power source system 10 according to the present exemplary embodiment is installed to a vehicle capable of switching between manual driving and autonomous driving.

The vehicle power source system 10 according to the present exemplary embodiment includes a first DC-to-DC converter 12, a main battery 14, primary system components 16, a redundant power source control section 18, a sub battery 20, and secondary system components 22.

The first DC-to-DC converter 12 converts to a voltage that can be supplied to the main battery 14, the primary system components 16, and the redundant power source control section 18 before supplying power thereto. In the present exemplary embodiment, the first DC-to-DC converter 12 steps down DC power of a predetermined voltage when supplying power to the main battery 14, the primary system components 16, and the redundant power source control section 18.

The main battery 14 is charged by power supplied from the first DC-to-DC converter 12, and is capable of supplying power to the primary system components 16 and the redundant power source control section 18.

The primary system components 16 are components installed in the vehicle that are driven using DC power supplied from the first DC-to-DC converter 12.

The redundant power source control section 18 is configured including a second DC-to-DC converter 24, a redundant power source ECU 26, and switches 28, 30.

The second DC-to-DC converter 24 is driven by the first DC-to-DC converter 12, and converts to a voltage that can be supplied to the secondary system components 22 and the sub battery 20 before supplying power thereto.

The redundant power source ECU 26 performs ON/OFF control of the switches 28, 30, so as to perform power source supply control during manual driving as well as performing power source supply control during autonomous driving. The redundant power source ECU 26 also monitors for failure of the power source for the primary system from the first DC-to-DC converter 12 during autonomous driving. In cases in which the primary system power source has failed, the redundant power source ECU 26 controls power supply to the secondary system components 22. Note that the redundant power source ECU 26 functions as a detector.

In the present exemplary embodiment, as control of power source supply during autonomous driving, the redundant power source ECU 26 closes the switch 28 and opens the switch 30 such that power from the first DC-to-DC converter 12 is supplied to both the primary system components 16 and the secondary system components 22. However, if the primary power source fails during autonomous driving, the redundant power source ECU 26 opens the switch 28 and closes the switch 30 as illustrated in FIG. 1 such that power is supplied from the first DC-to-DC converter 12 to the primary system components 16 and the second DC-to-DC converter 24, and power from the second DC-to-DC converter 24 is supplied to the sub battery 20 and the secondary system components 22. As illustrated in FIG. 2, a configuration is adopted in which power is supplied from the sub battery 20 to the secondary system components 22 in cases in which power from the first DC-to-DC converter 12 has failed.

The sub battery 20 is charged by power supplied from the second DC-to-DC converter 24. In cases in which power supplied from the first DC-to-DC converter 12 has failed, the sub battery 20 supplies power to the secondary system components 22 that are components required to ensure a fail-safe. Note that a battery capable of ensuring a voltage of a predetermined guaranteed voltage or greater is employed as the sub battery 20.

The secondary system components 22 are components required to ensure a fail-safe of the vehicle. For example, the secondary system components 22 are components that are driven to stop the vehicle safely in cases in which the primary system power source has failed during autonomous driving.

Figure 3:
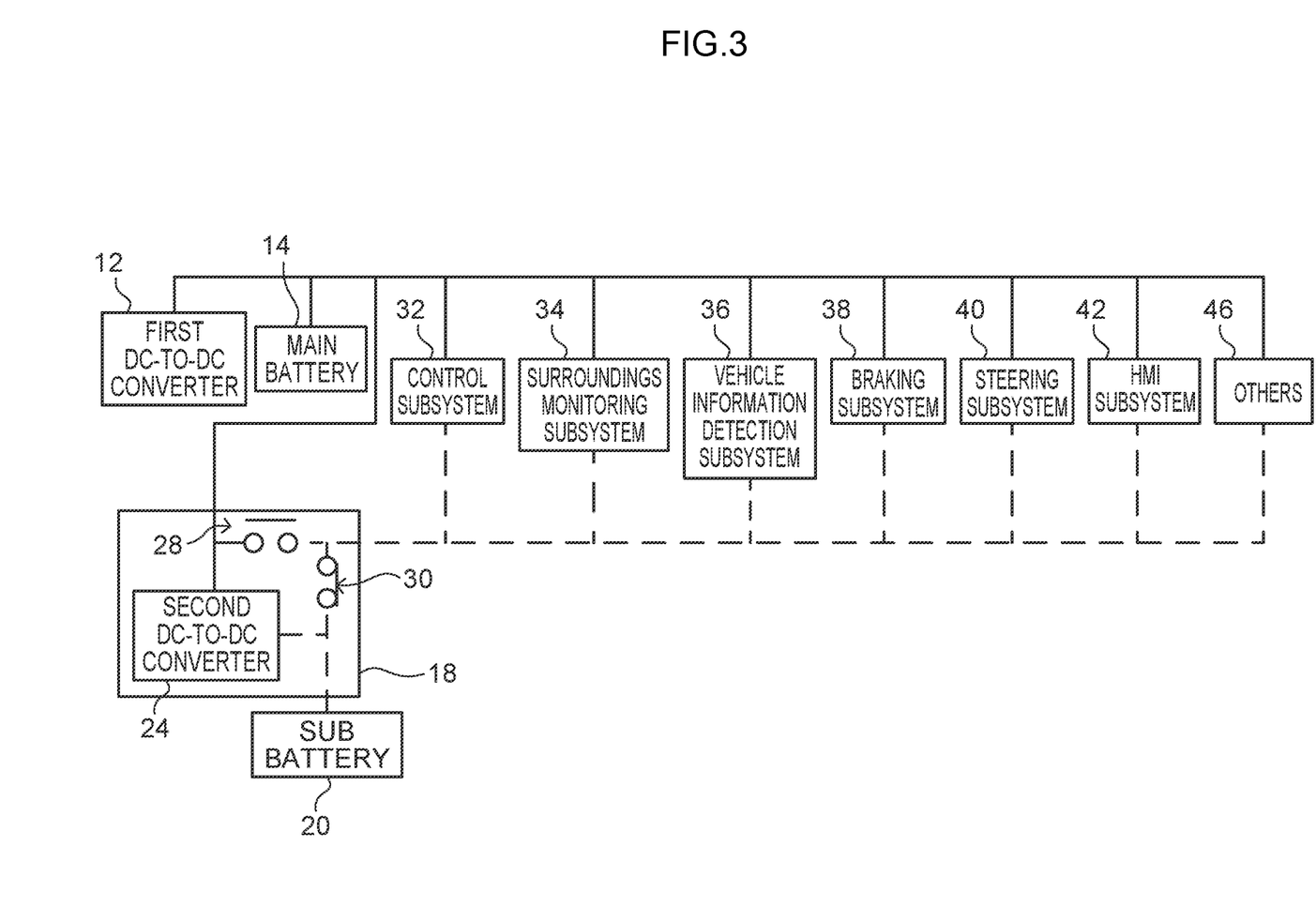
FIG. 3 is a block diagram illustrating a specific example of a power source configuration of a vehicle power source system according to an exemplary embodiment.

FIG. 3 is a block diagram illustrating a specific example of a power source configuration of the vehicle power source system 10 according to the present exemplary embodiment. Note that in FIG. 3, solid lines represent the power system of the primary system supplied with power from the first DC-to-DC converter 12, and dotted lines represent the power system of the secondary system supplied with power from the second DC-to-DC converter 24 or the sub battery 20.

As illustrated in FIG. 3, the components configuring the primary system components 16 and the secondary system components 22 can be categorized as being in a control subsystem 32, a surroundings monitoring subsystem 34, a vehicle information detection subsystem 36, a braking subsystem 38, a steering subsystem 40, a human machine interface (HMI) subsystem 42, and others 46. The respective categories can be split into primary system components 16 and secondary system components 22. The vehicle is driven by both the primary system components 16 and the secondary system components 22 during normal travel, whereas fail-safe driving is implemented by the secondary system components 22 alone when the primary power source fails. For example, a driving support electronic control unit (ECU) is an example of both a primary system component 16 and a secondary system component 22 of the control subsystem 32. Millimeter-wave radar and a stereo camera are examples of primary system components 16 of the surroundings monitoring subsystem 34, and LIDAR, a telephotographic camera, a locator camera, and a map generator system are examples of secondary system components 22 of the surroundings monitoring subsystem 34. A yaw sensor, a gyro sensor, and an acceleration sensor are examples of primary system components 16 of the vehicle information detection subsystem 36, and the map generator system is an example of a secondary system component 22 of the vehicle information detection subsystem 36. An actuator and so on to drive brakes, more specifically a motor to generate negative pressure for braking and a solenoid to release the generated negative pressure and to adjust the braking force, are examples of both primary system components 16 and secondary system components 22 of the braking subsystem 38. An electric power steering drive actuator is an example of both a primary system component 16 and a secondary system component 22 of the steering subsystem 40. A buzzer and a tell-tale lamp are examples of both primary system components 16 and secondary system components 22 of the HMI subsystem 42. Note that there are also other primary system components 16 and secondary system components 22 that do not correspond to any of the components described above.

Figure 4:
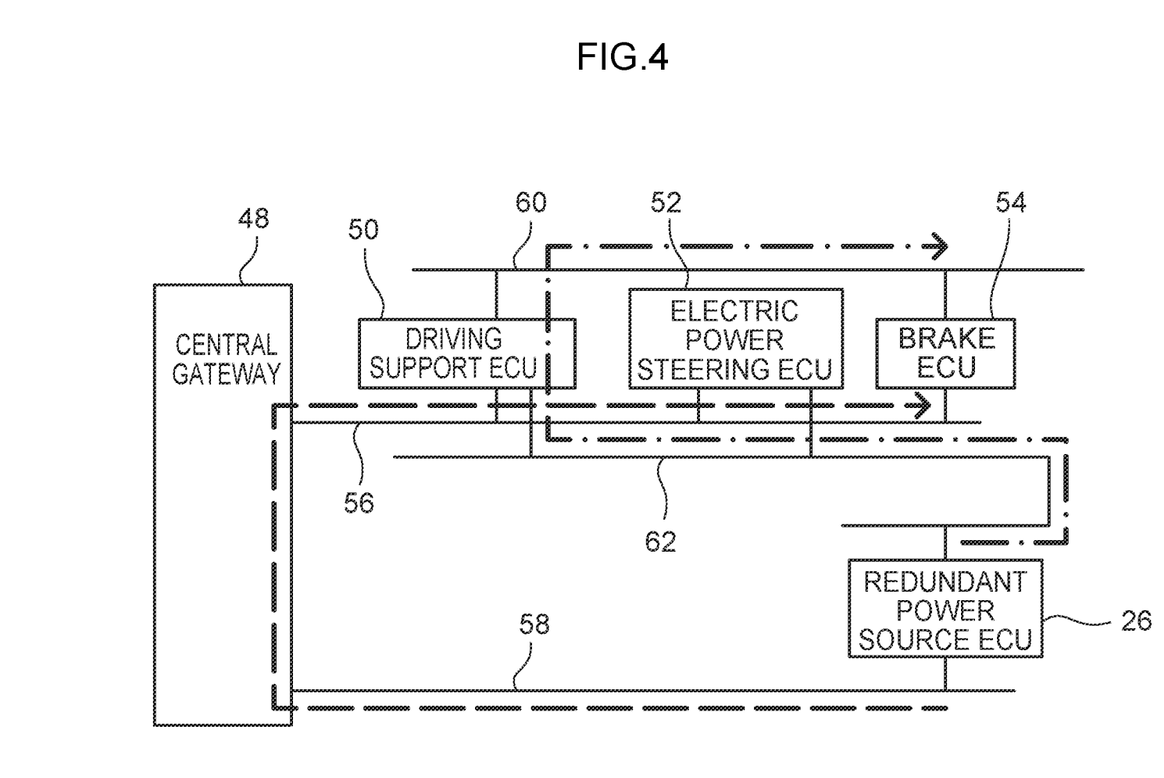
FIG. 4 is a block diagram illustrating a schematic configuration of CAN communication in a vehicle power source system according to an exemplary embodiment.

Next, explanation follows regarding an example of configuration of controller area network (CAN) communication in the vehicle power source system 10 according to the present exemplary embodiment. FIG. 4 is a block diagram illustrating a schematic configuration of CAN communication in the vehicle power source system 10 according to the present exemplary embodiment.

The vehicle power source system 10 according to the present exemplary embodiment includes ECUs such as a driving support ECU 50, an electric power steering ECU 52, a brake ECU 54, and the redundant power source ECU 26, these ECUs being connected by plural CANs. Note that there are also other ECUs that perform various control, but explanation of these ECUs is omitted here. Moreover, although an example is described is which connection is made over plural CANs in the present exemplary embodiment, there is no limitation thereto, and connection may be made over a single CAN.

The driving support ECU 50 controls switching between manual driving and autonomous driving, performs various control during autonomous driving, and so on.

The electric power steering ECU 52 controls the electric power steering by controlling driving of a motor and the like.

The brake ECU 54 controls driving of the motor that generates negative pressure for braking, the solenoid that uses the generated negative pressure to adjust the braking force, and so on mentioned previously. Note that in the brake system, a relief valve is operated to release negative pressure in cases in which the accumulated negative pressure generated by the motor has risen to a predetermined pressure or greater.

The driving support ECU 50, the electric power steering ECU 52, and the brake ECU 54 are connected to a central gateway 48 through a first CAN 56.

The redundant power source ECU 26 is connected to the central gateway 48 through a second CAN 58.

The driving support ECU 50 and the brake ECU 54 are also connected over a third CAN 60, and the driving support ECU 50, the electric power steering ECU 52, and the redundant power source ECU 26 are connected over a fourth CAN 62.

In the present exemplary embodiment, in cases in which the primary system power source is operating normally without failure via the first DC-to-DC converter 12, the redundant power source ECU 26 transmits instructions such as braking instructions to the brake ECU 54 along a path illustrated by a dotted line and arrow in FIG. 4. Namely, instructions such as braking instructions are transmitted to the brake ECU 54 through the second CAN 58, the central gateway 48, and the first CAN 56.

In cases in which the primary system power source via the first DC-to-DC converter 12 has failed, the redundant power source ECU 26 transmits instructions such as braking instructions to the brake ECU 54 along a path illustrated by a single-dotted dashed line and arrow in FIG. 4. Namely, instructions such as braking instructions are transmitted to the brake ECU 54 through the fourth CAN 62, the driving support ECU 50, and the third CAN 60.

Figure 5:
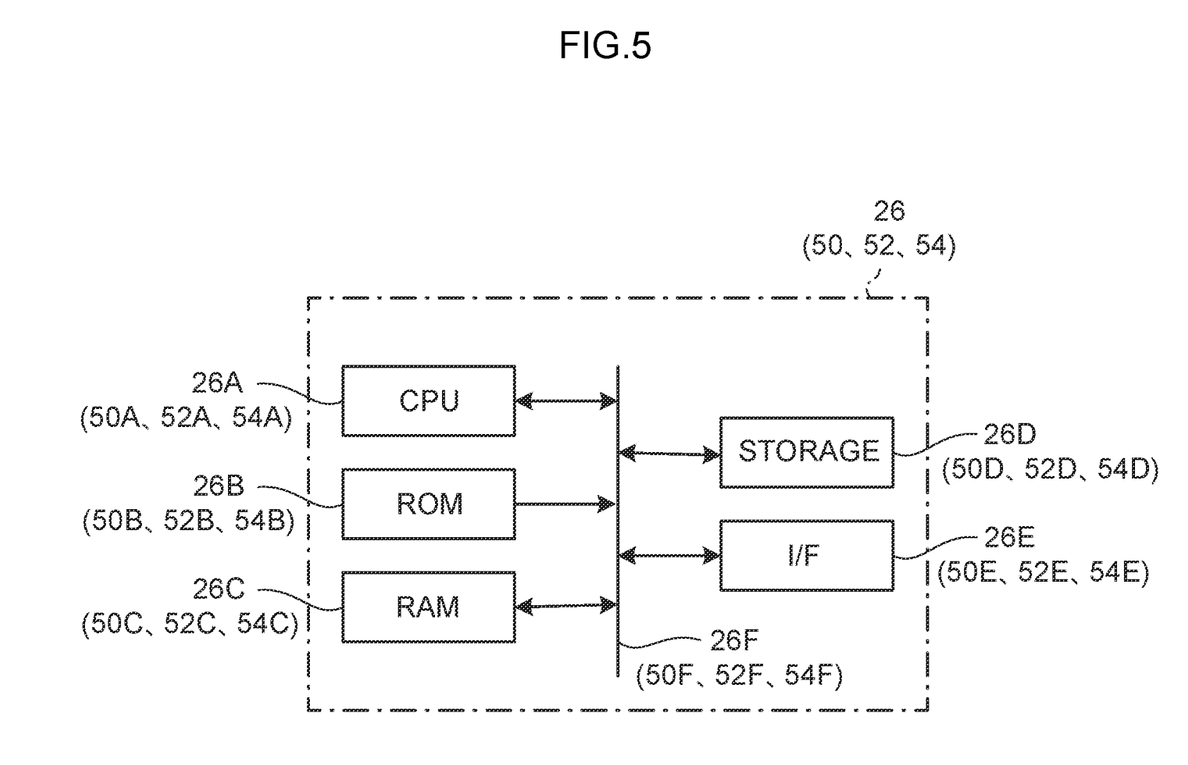
FIG. 5 is a block diagram illustrating hardware configuration of a driving support ECU, an electric power steering ECU, a brake ECU, and a redundant power source ECU.

FIG. 5 is a block diagram illustrating hardware configuration of the driving support ECU 50, the electric power steering ECU 52, the brake ECU 54, and the redundant power source ECU 26. Since each of the ECUs has basically the same configuration, the following explanation uses the redundant power source ECU 26 as a representative example.

As illustrated in FIG. 5, the redundant power source ECU 26 is configured by a standard microcomputer including a central processing unit (CPU) 26A, read only memory (ROM) 26B, random access memory (RAM) 26C, storage 26D, an interface (I/F) 26E, a bus 26F, and the like.

The redundant power source ECU 26 executes control to suppress a drop in power source voltage, described below, by the CPU 26A expanding and executing a program held in the ROM 26B in the RAM 26C. Note that the other ECUs also perform various control by the corresponding CPU expanding and executing a program held in the ROM in the RAM.

Explanation follows regarding the voltage drop suppression control of the vehicle power source system 10 according to the present exemplary embodiment.

The vehicle power source system 10 according to the present exemplary embodiment includes a fail-safe function to supply power to the secondary system components 22 using the secondary system power source in cases in which the primary system power source via the first DC-to-DC converter 12 has failed.

In the present exemplary embodiment, the secondary system components 22 include components that draw an inrush current. The motor for generating negative brake pressure is one example of a component that draws an inrush current, and there may be other components.

Figure 6:
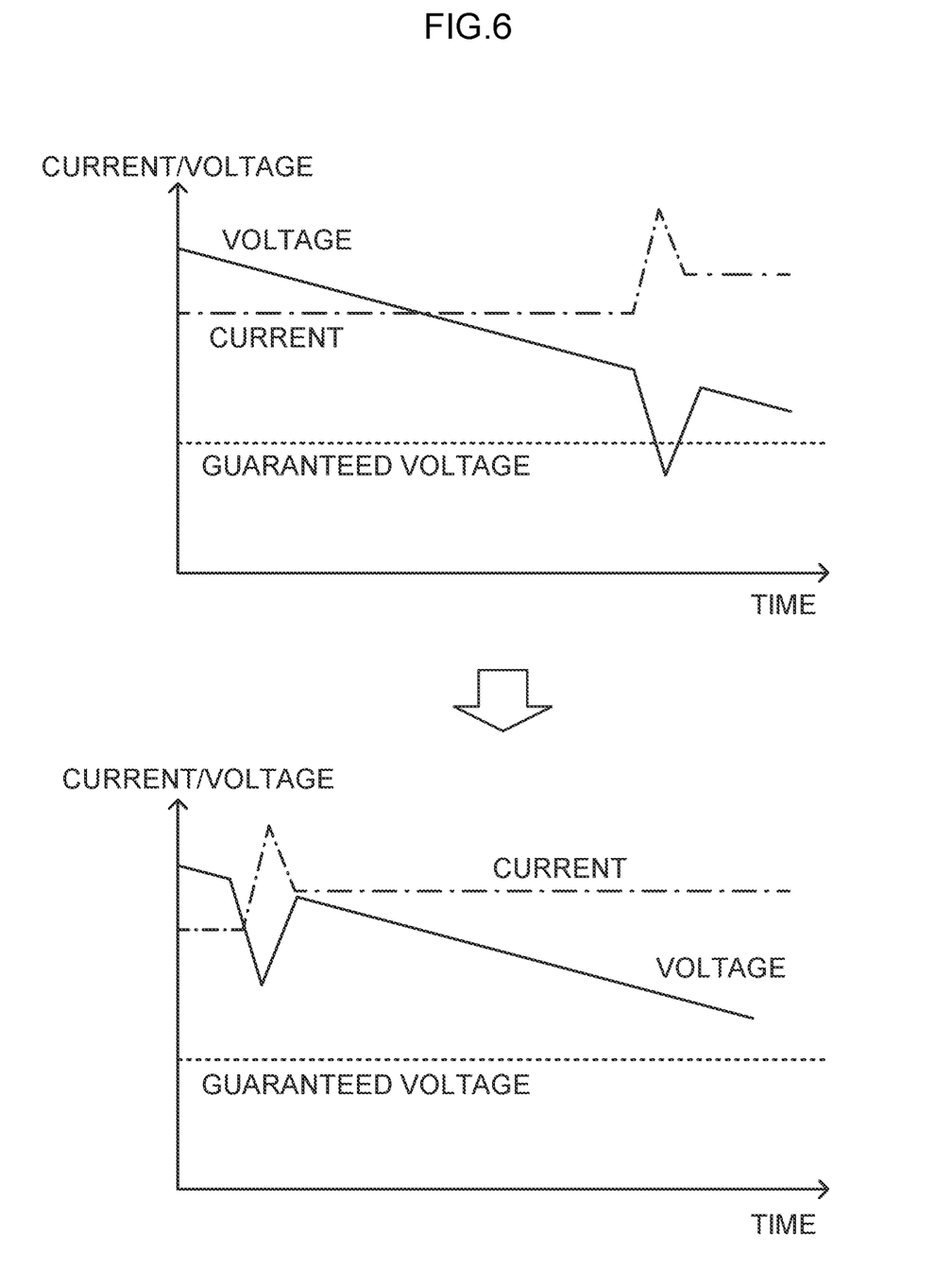
FIG. 6 is a diagram for explaining control to suppress a voltage dip in a vehicle power source system according to a first exemplary embodiment.

The fail-safe power source is driven by the sub battery 20 serving as the secondary system power source, and so the voltage of the sub battery 20 gradually falls as time passes when the primary system power source has failed. As illustrated in the upper part of FIG. 6, driving the motor in a state in which the voltage of the sub battery 20 is falling might draw an inrush current which would cause the voltage to dip below the predetermined guaranteed voltage.

As voltage drop suppression control in the present exemplary embodiment, in cases in which the primary system power source has failed, the redundant power source ECU 26 controls operation timings of components that draw an inrush current prior to the sub battery 20 voltage falling, regardless of whether or not operation has been requested. Specifically, in cases in which the primary system power source has failed, such control of operation timings of components that draw an inrush current involves the redundant power source ECU 26 outputting an operating instruction to the brake ECU 54 regarding secondary system components 22 that draw an inrush current. As illustrated in the lower part of FIG. 6, this enables the secondary system components 22 that draw an inrush current to be caused to operate prior to the sub battery 20 voltage falling, thereby enabling the voltage to be suppressed from dipping to the guaranteed voltage or below.

Figure 7:
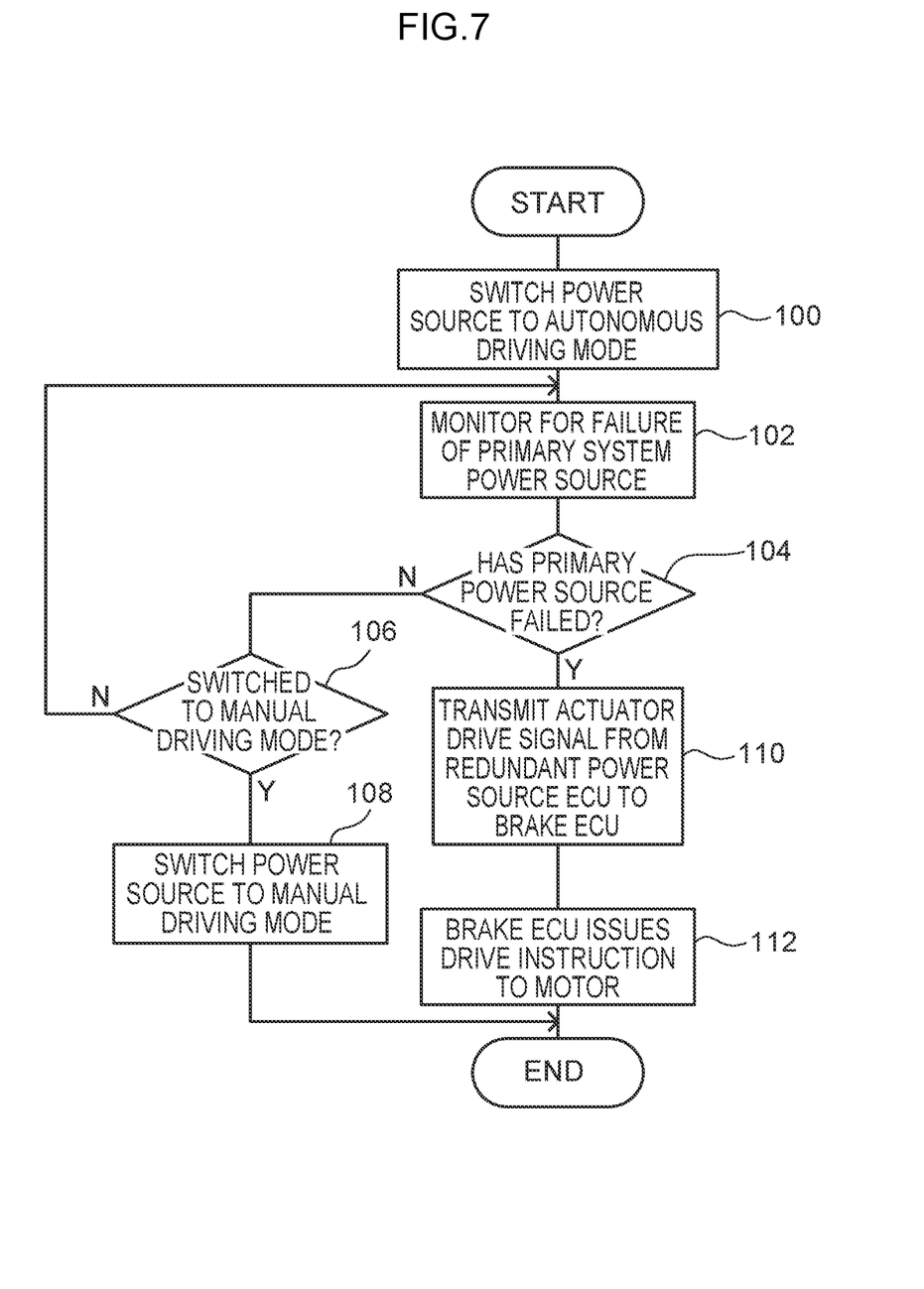
FIG. 7 is a flowchart illustrating an example of a flow of processing performed by a vehicle power source system according to the first exemplary embodiment.

Next, explanation follows regarding specific processing performed by the vehicle power source system 10 according to the present exemplary embodiment configured as described above. FIG. 7 is a flowchart illustrating an example of a flow of processing performed by the vehicle power source system 10 according to the present exemplary embodiment. Note that the processing in FIG. 7 starts in cases in which a switch to an autonomous driving mode has been instructed.

At step 100, the redundant power source ECU 26 switches the power source to the autonomous driving mode, and processing transitions to step 102. Specifically, the redundant power source ECU 26 opens the switch 28 and closes the switch 30 of the redundant power source control section 18.

At step 102, the redundant power source ECU 26 monitors for failure in the primary system power source, and processing transitions to step 104. For example, the redundant power source ECU 26 monitors the voltage input to the second DC-to-DC converter 24. Note that step 102 corresponds to an example of a detector.

At step 104, the redundant power source ECU 26 determines whether or not the primary system power source has failed. This determination is for example made by determining whether or not a voltage of a predetermined threshold or below has continued for at least a predetermined duration. Processing transitions to step 106 in cases in which negative determination is made, whereas processing transitions to step 110 in cases in which affirmative determination is made.

At step 106, the redundant power source ECU 26 determines whether or not a switch to a manual driving mode has been made. This determination is for example made by the redundant power source ECU 26 determining whether or not an instruction to switch to the manual driving mode has been received from another ECU such as the driving support ECU 50. Processing returns to step 102 and the above-described processing is repeated in cases in which negative determination is made, whereas processing transitions to step 108 in cases in which affirmative determination is made.

At step 108, the redundant power source ECU 26 switches the power source to the manual driving mode, and the processing routine is ended. Specifically, the redundant power source ECU 26 closes both the switch 28 and the switch 30 of the redundant power source control section 18.

On the other hand, at step 110, the redundant power source ECU 26 transmits a drive signal to the brake ECU 54 for the actuator that draws an inrush current. In the present exemplary embodiment, in cases in which the primary system power source has failed, a drive signal cannot be transmitted from the redundant power source ECU 26 to the brake ECU 54 via the central gateway 48 as illustrated by the solid lines and arrow in FIG. 4. Thus, a drive signal is transmitted to the driving support ECU 50 via the fourth CAN 62, and the driving support ECU 50 transmits a drive signal to the brake ECU 54 via the third CAN 60, as illustrated by the single-dotted dashed lines and arrow in FIG. 4.

At step 112, the brake ECU 54 issues a drive instruction to the motor that draws an inrush current, and the processing routine is ended. In this manner, secondary system components 22 that draw an inrush current can be caused to operate prior to the voltage of the sub battery 20 falling to the guaranteed voltage or below, regardless of whether or not operation has been requested, thereby enabling the voltage to be suppressed from dipping to the guaranteed voltage or below. Note that step 112 corresponds to an example of a controller.

Second Exemplary Embodiment

Next, explanation follows regarding a vehicle power source system according to a second exemplary embodiment. The vehicle power source system according to the present exemplary embodiment only differs to the first exemplary embodiment in the voltage drop suppression control, and has the same configuration as that of the first exemplary embodiment, and so detailed explanation thereof is omitted.

Figure 8:
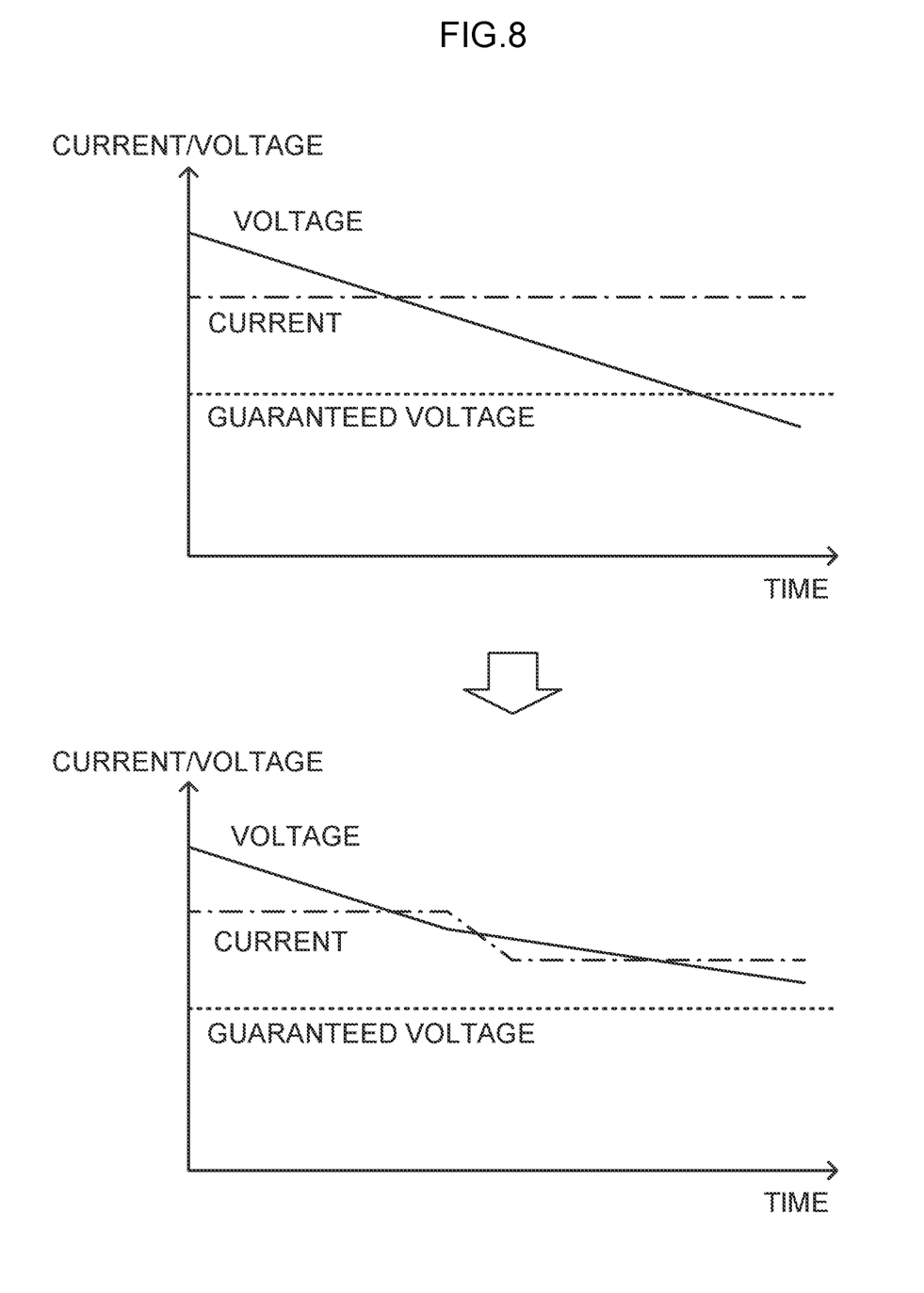
FIG. 8 is a diagram for explaining control to suppress a drop in voltage in a vehicle power source system according to a second exemplary embodiment.

Similarly to in the above exemplary embodiment, the present exemplary embodiment includes a power source fail-safe function. The fail-safe power source is driven by the sub battery 20 serving as the secondary system power source, and so the voltage gradually falls as time passes when the primary system power source has failed. As illustrated in the upper part of FIG. 8, driving the motor in a state in which a large current load continues to be provided, or the voltage of the sub battery 20 is falling might draw an inrush current which would cause the voltage to dip below the predetermined guaranteed voltage.

In the present exemplary embodiment, the redundant power source ECU 26 notifies ECUs with a load subject to a predetermined power limitation connected thereto in cases in which the primary system power source has failed. Thus, the ECUs that have received the power source failure notification limit the current to, or interrupt operation of, the target secondary system components 22, such that the voltage is suppressed from falling to the predetermined guaranteed voltage or below, as illustrated in the lower part of FIG. 8.

Secondary system components 22 relating to user notification, such as the tell-tale lamp or buzzer, are examples of loads that may be subject to a power limitation. As long as enough time can be secured for a user to notice such notification, the notification may be interrupted during the fail-safe.

As another example, after the vehicle has sufficiently decelerated during fail-safe, the cruising distance is reduced and long distance monitoring of the vehicle is no longer required, and so the telephotographic camera and lamps etc. that shine light ahead to allow the telephotographic camera to capture images may be interrupted.

As another example, a voltage dip due to switching from high beam to low beam or the like may be suppressed.

Note that the driving support ECU 50 is an example of an ECU that may have a load subject to a predetermined power limitation connected thereto. In such cases, the driving support ECU 50 corresponds to an example of a controller.

Figure 9:
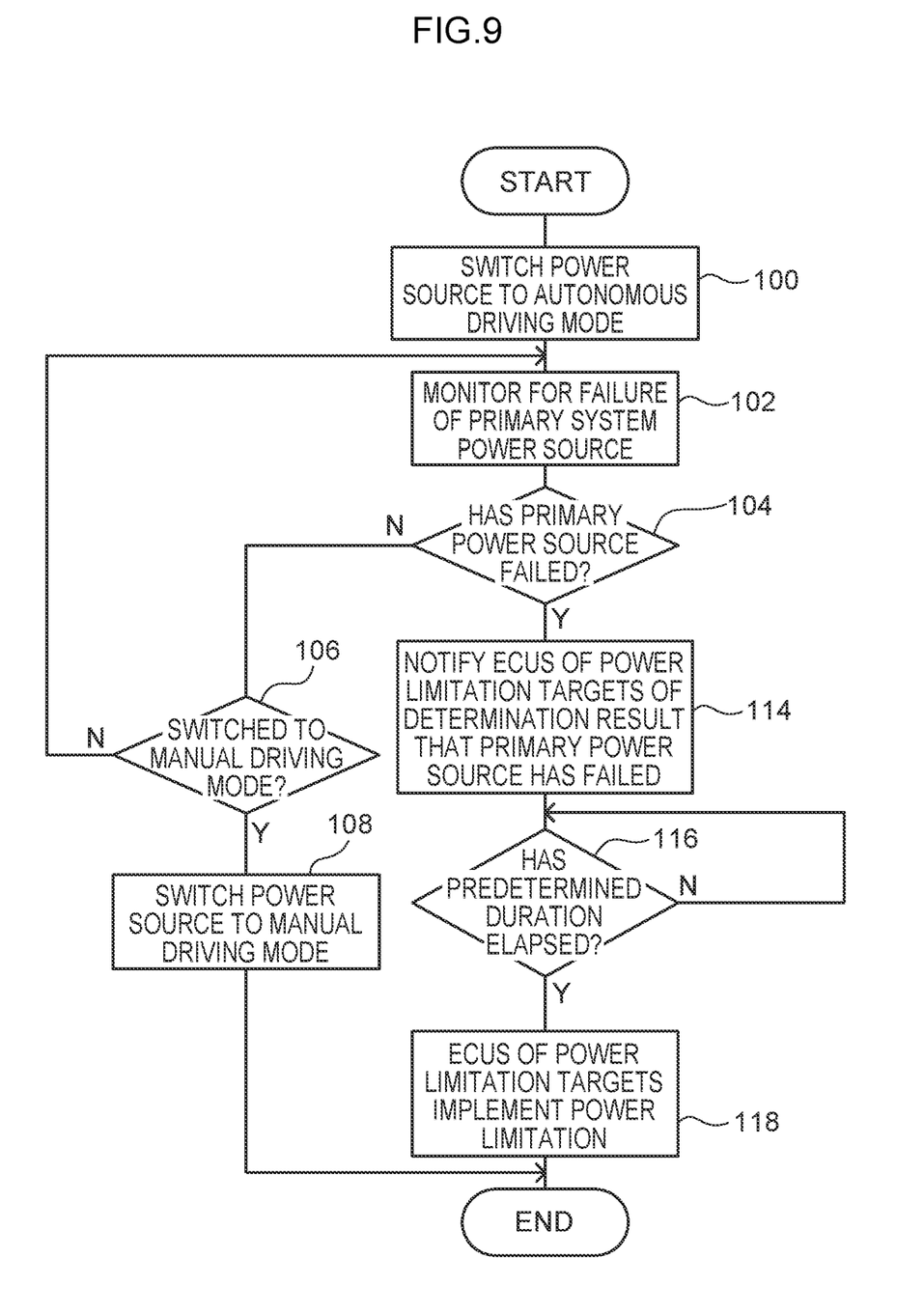
FIG. 9 is a flowchart illustrating an example of a flow of processing performed by a vehicle power source system according to the second exemplary embodiment.

Next, explanation follows regarding specific processing performed by the vehicle power source system 10 according to the present exemplary embodiment configured as described above. FIG. 9 is a flowchart illustrating an example of a flow of processing performed by the vehicle power source system 10 according to the present exemplary embodiment. Note that the same reference numerals are applied to processing in FIG. 9 that is the same as the processing in FIG. 7. Note that the processing in FIG. 9 starts in cases in which a switch to the autonomous driving mode has been instructed.

At step 100, the redundant power source ECU 26 switches the power source to the autonomous driving mode, and processing transitions to step 102. Specifically, the redundant power source ECU 26 opens the switch 28 and closes the switch 30 of the redundant power source control section 18.

At step 102, the redundant power source ECU 26 monitors for failure in the primary system power source, and processing transitions to step 104. For example, the redundant power source ECU 26 monitors the voltage input to the second DC-to-DC converter 24. Note that step 102 corresponds to an example of a detector.

At step 104, the redundant power source ECU 26 determines whether or not the primary system power source has failed. This determination is for example made by determining whether or not a voltage of a predetermined threshold or below has continued for at least a predetermined duration. Processing transitions to step 106 in cases in which negative determination is made, whereas processing transitions to step 114 in cases in which affirmative determination is made.

At step 106, the redundant power source ECU 26 determines whether or not a switch to the manual driving mode has been performed. This determination is for example made by the redundant power source ECU 26 determining whether or not an instruction to switch to the manual driving mode has been received from another ECU such as the driving support ECU 50. Processing returns to step 102 and the above-described processing is repeated in cases in which negative determination is made, whereas processing transitions to step 108 in cases in which affirmative determination is made.

At step 108, the redundant power source ECU 26 switches the power source to the manual driving mode, and the processing routine is ended. Specifically, the redundant power source ECU 26 closes both the switch 28 and the switch 30 of the redundant power source control section 18.

On the other hand, at step 114, the redundant power source ECU 26 notifies the ECUs of predetermined power limitation targets of the determination result that the primary power source has failed, and processing transitions to step 116.

Figure 10:
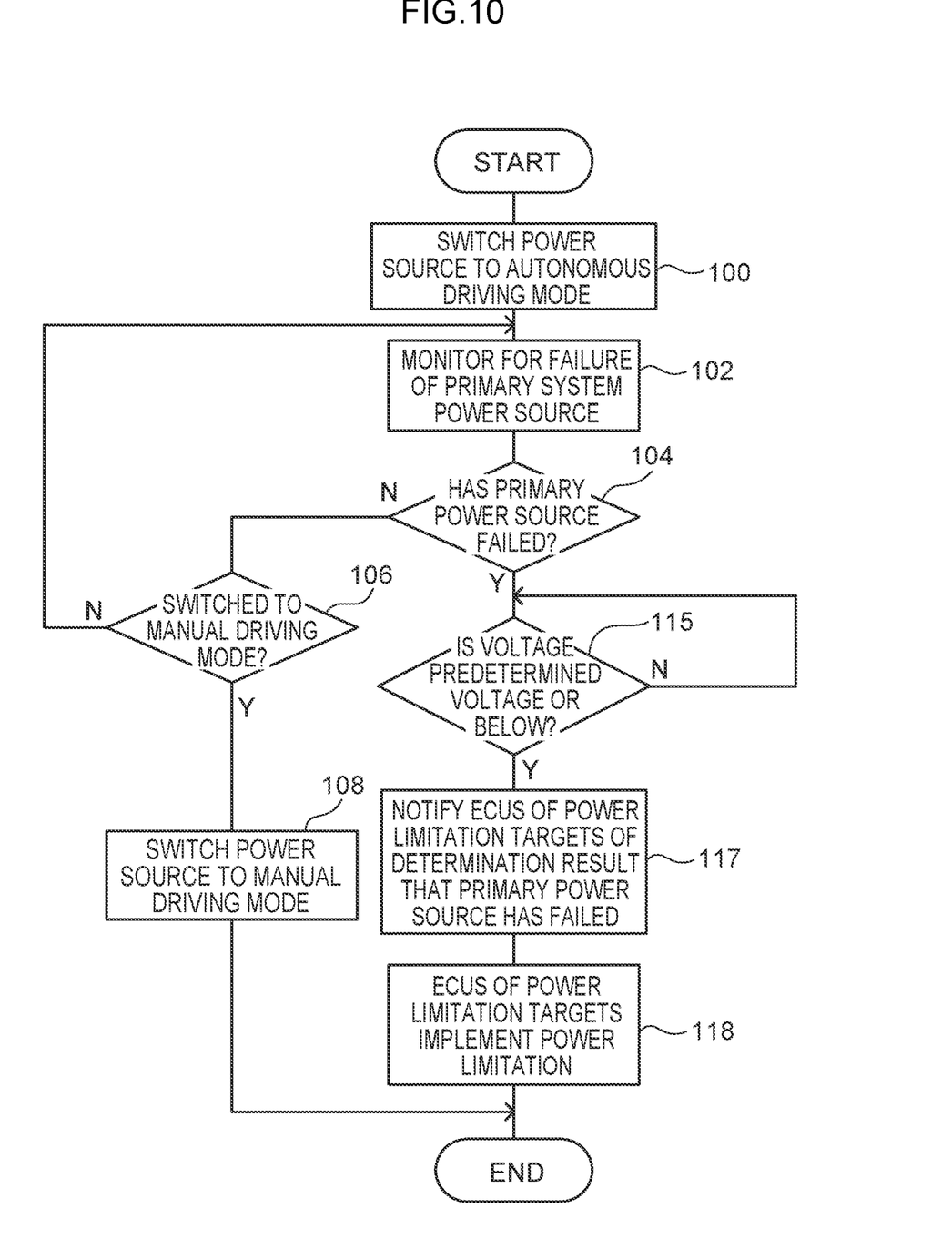
FIG. 10 is a flowchart illustrating a modified example of a flow of processing performed by a vehicle power source system according to the second exemplary embodiment.

At step 116, the ECUs of power limitation targets determine whether or not a predetermined duration has elapsed since being notified of the determination result that the primary power source has failed, and stand by until determination is affirmative, after which processing transitions to step 118. Note that at steps 114 and 116, the redundant power source ECU 26 may notify the ECUs of predetermined power limitation targets of the determination result that the primary power source has failed after a predetermined duration has elapsed since detecting the primary power source failure. As an alternative to steps 114 and 116, the redundant power source ECU 26 may determine at steps 115 and 117 in FIG. 10 whether or not the voltage is a predetermined voltage or below that is larger than the guaranteed voltage. In cases in which the voltage has fallen to the predetermined voltage or below, the redundant power source ECU 26 notifies the ECUs of predetermined power limitation targets of the determination result that the primary power source has failed.

At step 118, the ECUs of power limitation targets implement the power limitation, and the processing routine is ended. Namely, the ECUs of power limitation targets either limit current to, or interrupt operation of, the predetermined target secondary system components 22. Thus, as illustrated in the lower part of FIG. 8, the time taken for the voltage to drop to the guaranteed voltage or below can be lengthened, and the voltage can be suppressed from falling to the guaranteed voltage or below within a pre-requested duration. Note that step 118 corresponds to an example of a controller.

Third Exemplary Embodiment

Next, explanation follows regarding a vehicle power source system according to a third exemplary embodiment. The vehicle power source system according to the present exemplary embodiment is a combination of the first exemplary embodiment and the second exemplary embodiment, and so only the flow of processing is described below. In the present exemplary embodiment, an example is described in which the voltage drop suppression control of the first exemplary embodiment is performed, after which the voltage drop suppression control of the second exemplary embodiment is performed. However, the voltage drop suppression control of the first exemplary embodiment may be performed after the voltage drop suppression control of the second exemplary embodiment has been performed.

Figure 11:
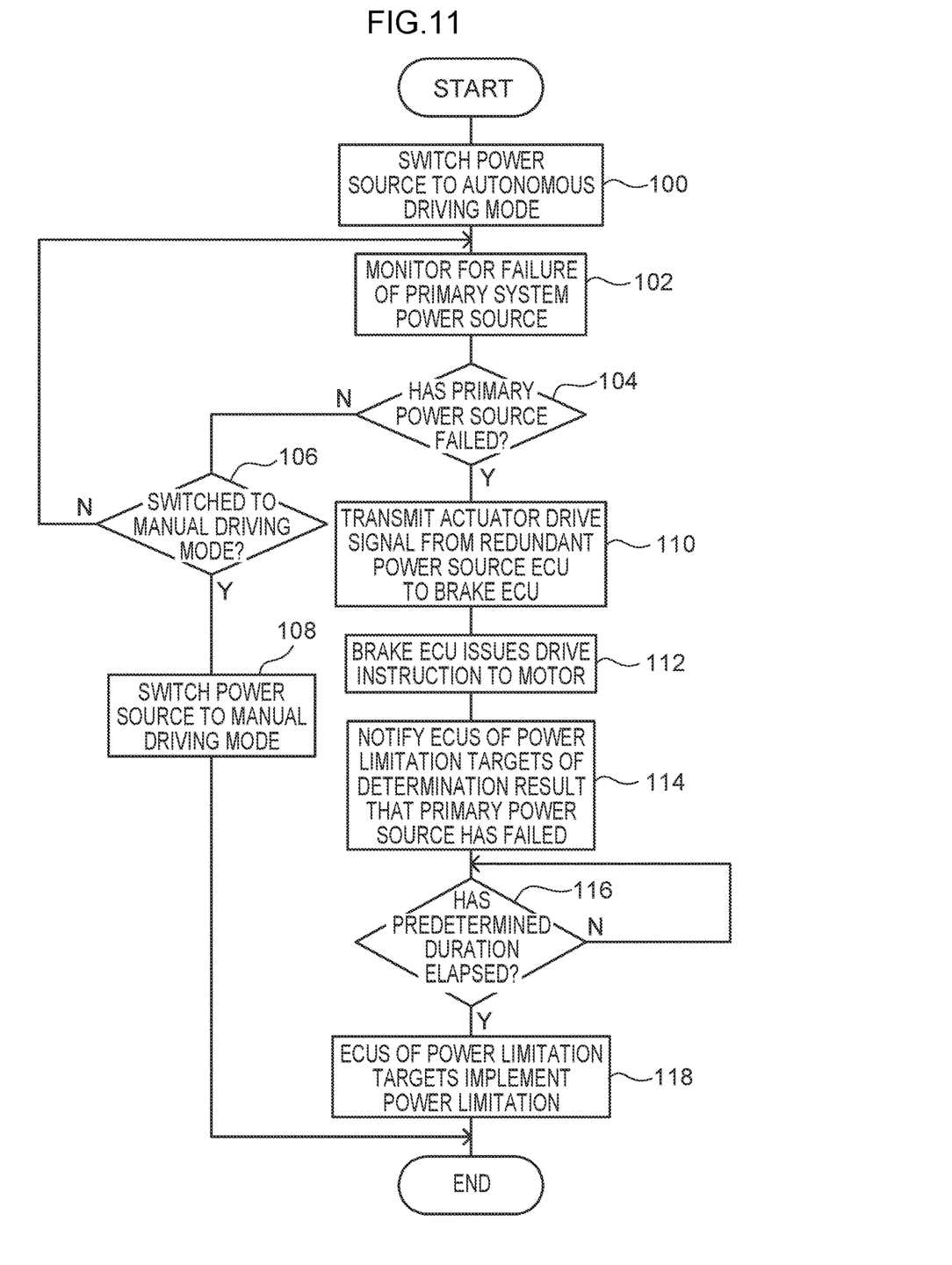
FIG. 11 is a flowchart illustrating an example of a flow of processing performed by a vehicle power source system according to a third exemplary embodiment.

FIG. 11 is a flowchart illustrating an example of a flow of processing performed by a vehicle power source system 10 according to the present exemplary embodiment. Note that the same reference numerals are applied to processing in FIG. 11 that is the same as the processing in FIGS. 7 and 9. The processing in FIG. 11 starts in cases in which a switch to the autonomous driving mode has been instructed.

At step 100, the redundant power source ECU 26 switches the power source to the autonomous driving mode, and processing transitions to step 102. Specifically, the redundant power source ECU 26 opens the switch 28 and closes the switch 30 of the redundant power source control section 18.

At step 102, the redundant power source ECU 26 monitors for failure of the primary system power source, and processing transitions to step 104. For example, the redundant power source ECU 26 monitors the voltage input to the second DC-to-DC converter 24. Note that step 102 corresponds to an example of a detector.

At step 104, the redundant power source ECU 26 determines whether or not the primary system power source has failed. This determination is for example made by determining whether or not a voltage of a predetermined threshold or below has continued for at least a predetermined duration. Processing transitions to step 106 in cases in which negative determination is made, whereas processing transitions to step 110 in cases in which affirmative determination is made.

At step 106, the redundant power source ECU 26 determines whether or not a switch to the manual driving mode has been performed. This determination is for example made by the redundant power source ECU 26 determining whether or not an instruction to switch to the manual driving mode has been received from another ECU such as the driving support ECU 50. Processing returns to step 102 and the above-described processing is repeated in cases in which negative determination is made, whereas processing transitions to step 108 in cases in which affirmative determination is made.

At step 108, the redundant power source ECU 26 switches the power source to the manual driving mode, and the processing routine is ended. Specifically, the redundant power source ECU 26 closes both the switch 28 and the switch 30 of the redundant power source control section 18.

On the other hand, at step 110, the redundant power source ECU 26 transmits a drive signal for the actuator that draws an inrush current to the brake ECU 54. In the present exemplary embodiment, in cases in which the primary system power source has failed, a drive signal cannot be transmitted from the redundant power source ECU 26 to the brake ECU 54 via the central gateway 48 as illustrated by the solid lines and arrow in FIG. 4. Thus, a drive signal is transmitted to the driving support ECU 50 via the fourth CAN 62, and the driving support ECU 50 transmits a drive signal to the brake ECU 54 via the third CAN 60, as illustrated by the single-dotted dashed lines and arrow in FIG. 4.

At step 112, the brake ECU 54 issues a drive instruction to the motor that draws an inrush current, and processing transitions to step 114. In this manner, secondary system components 22 that draw an inrush current can be caused to operate prior to the voltage of the sub battery 20 falling, regardless of whether or not operation has been requested, thereby enabling the voltage to be suppressed from dipping to the guaranteed voltage or below.

At step 114, the redundant power source ECU 26 notifies the ECUs of predetermined power limitation targets of the determination result that the primary power source has failed, and processing transitions to step 116.

Figure 12:
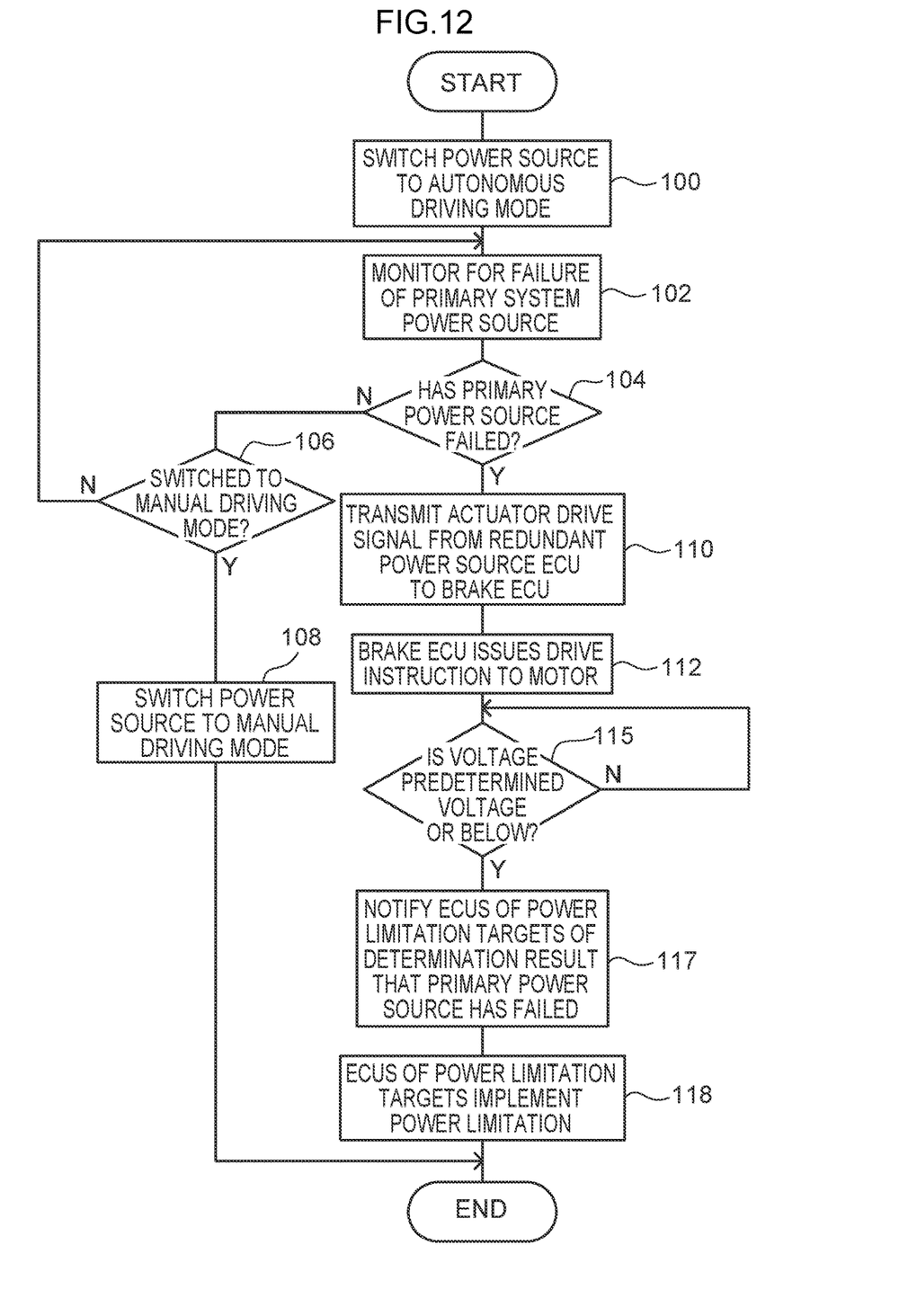
FIG. 12 is a flowchart illustrating a modified example of a flow of processing performed by a vehicle power source system according to the third exemplary embodiment.

At step 116, the ECUs of power limitation targets determine whether or not a predetermined duration has elapsed since being notified of the determination result that the primary power source has failed, and stand by until determination is affirmative, after which processing transitions to step 118. Note that at steps 114 and 116, the redundant power source ECU 26 may notify the ECUs of predetermined power limitation targets of the determination result that the primary power source has failed after a predetermined duration has elapsed since detecting the primary power source failure. As an alternative to steps 114 and 116, the redundant power source ECU 26 may determine at steps 115 and 117 in FIG. 12 whether or not the voltage has fallen to a predetermined voltage or below that is larger than the guaranteed voltage. In cases in which the voltage has fallen to the predetermined voltage or below, the redundant power source ECU 26 notifies the ECUs of predetermined power limitation targets of the determination result that the primary power source has failed.

At step 118, the ECUs of power limitation targets implement the power limitation, and the processing routine is ended. Namely, the ECUs of power limitation targets either limit current to, or interrupt operation of, the predetermined target secondary system components 22. Thus, the time taken for the voltage to drop to the predetermined guaranteed voltage or below can be lengthened, and the voltage can be suppressed from falling to the guaranteed voltage or below within a predetermined requested duration. Note that step 118 corresponds to an example of a controller.

Note that in the vehicle power source system 10 of the above exemplary embodiments, there are delays in the failure determination time, CAN communication, and so on during the time from the failure occurring in the primary system power source to the time that the secondary system components 22 that draw an inrush current are driven or to the time that a power limitation is implemented, and so the control is designed in consideration of such delays.

Although an example of vehicle power source system 10 installed to a vehicle has been described in the above exemplary embodiments, there is no limitation thereto. Application may be made to a power source system installed to other equipment.

Moreover, although the control performed by the respective ECUs of the vehicle power source system 10 has been described as software processing performed by executing programs in the above exemplary embodiments, there is no limitation thereto. For example, the control may be processing performed by hardware such as a graphics processing unit (GPU), an application specific integrated circuit (ASIC), or a field-programmable gate array (FPGA). Alternatively, the processing may be performed by a combination of both software and hardware. In cases in which the processing is performed by software, the programs may be stored in and distributed as various storage media.

Furthermore, the present disclosure is not limited to the above description, and obviously various other modifications may be implemented within a range not departing from the spirit of the present disclosure.

The invention claimed is:

1. A power source control device for a vehicle comprising:
a detector configured to detect failure of a main power source; and
a controller configured to perform operational control of a component supplied with power from a sub battery such that a predetermined guaranteed voltage is maintained for at least a predetermined requested duration in cases in which failure of the main power source has been detected by the detector during autonomous driving of the vehicle,
wherein, when the failure of the main power source has been detected, as the operational control, the controller is configured to:
control operation timings and cause operation, by the sub battery, of a plurality of predetermined components that draw an inrush current, regardless of whether or not there is a request for the operation of the predetermined components at a time when the failure of the main power source has been detected, and
cause the predetermined components that draw the inrush current to operate prior to a failure of a voltage of the sub battery by preventing the voltage of the sub battery from dropping to or below the guaranteed voltage.

2. The power source control device of claim 1, wherein as the operational control, the controller is configured to limit a power supply from the sub battery to a predetermined interruptible component.

3. The power source control device of claim 2, wherein the controller is configured to limit the power supply either after a predetermined duration has elapsed or in cases in which a voltage of the sub battery has fallen to a predetermined voltage or below.

4. The power source control device of claim 1, wherein, in cases in which failure of the main power supply has been detected by the detector during autonomous driving of the vehicle, the controller is configured to cause the operation by the sub battery of the plurality of predetermined components that draw the inrush current, regardless of whether or not the operation has been requested and then limit a power supply from the sub battery to a predetermined interruptible component.

5. The power source control device of claim 4, wherein the controller is configured to limit the power supply in cases in which the voltage of the sub battery has fallen to or below a predetermined voltage after the controller has caused the operation by the sub battery of the plurality of predetermined components that draw the inrush current.

6. The power source control device according to claim 1, wherein
the plurality of predetermined components include a braking system, and
when the failure of the main power source has been detected, as the operational control, the controller is configured to cause, via the sub battery, the braking system to issue drive instruction to a motor that draws the inrush current, regardless of whether or not there is a request for the driving of the motor at the time when the failure of the main power source has been detected.

7. The power source control device according to claim 1, wherein
the plurality of predetermined components include a control subsystem, a surroundings monitoring subsystem, a vehicle information detection subsystem, a braking subsystem, a steering subsystem, and a human-machine interface subsystem.

* * * * *